United States Patent
McCullough

(10) Patent No.: US 6,868,602 B2
(45) Date of Patent: Mar. 22, 2005

(54) METHOD OF MANUFACTURING A STRUCTURAL FRAME

(75) Inventor: Kevin A. McCullough, Warwick, RI (US)

(73) Assignee: Cool Options, Inc., Warwick, RI (US)

( * ) Notice: Subject to any disclaimer, the term of this patent is extended or adjusted under 35 U.S.C. 154(b) by 54 days.

(21) Appl. No.: 10/050,384

(22) Filed: Jan. 16, 2002

(65) Prior Publication Data

US 2002/0092160 A1 Jul. 18, 2002

Related U.S. Application Data

(63) Continuation of application No. 09/725,359, filed on Nov. 29, 2000, now abandoned.
(60) Provisional application No. 60/168,275, filed on Dec. 1, 1999.

(51) Int. Cl.$^7$ .............................. H05K 3/30; H05K 7/20
(52) U.S. Cl. ............................ 29/832; 29/841; 29/848; 29/856; 264/328.18; 361/704; 361/705; 361/707; 361/708; 361/720; 174/35 R
(58) Field of Search .......................... 29/DIG. 29, 827, 29/832, 834, 841, 848, 855, 856; 264/328.18; 361/814, 704, 705, 707, 708, 719, 720, 700, 715 A, 818; 174/35 R, 35 GC, 35 MS; 257/678, 712; 526/280, 281

(56) References Cited

U.S. PATENT DOCUMENTS

| | | | |
|---|---|---|---|
| 5,129,448 A | | 7/1992 | Holmberg, Jr. et al. ........ 165/86 |
| 5,430,609 A | | 7/1995 | Kikinis ......................... 361/687 |
| 5,513,070 A | | 4/1996 | Xie et al. ..................... 361/700 |
| 5,552,960 A | | 9/1996 | Nelson et al. ............... 361/687 |
| 5,557,500 A | | 9/1996 | Baucom et al. ............. 361/687 |
| 5,561,208 A | * | 10/1996 | Takahashi et al. ........... 526/281 |
| 5,606,341 A | | 2/1997 | Aguilera ....................... 345/87 |
| 5,621,613 A | | 4/1997 | Haley et al. ................. 361/687 |
| 5,646,822 A | | 7/1997 | Bhatia et al. ................ 361/687 |
| 5,661,339 A | * | 8/1997 | Clayton ....................... 257/678 |
| 5,666,261 A | | 9/1997 | Aguilera ..................... 361/681 |
| 5,708,566 A | | 1/1998 | Hunninghaus et al. ...... 361/764 |
| 5,718,282 A | | 2/1998 | Bhatia et al. .................. 165/86 |
| 5,757,615 A | | 5/1998 | Donahoe et al. ............ 361/687 |
| 5,764,483 A | | 6/1998 | Ohashi et al. ............... 361/699 |
| 5,781,409 A | | 7/1998 | Mecredy, III ............... 361/687 |
| 5,790,376 A | | 8/1998 | Moore ......................... 361/700 |
| 5,796,581 A | | 8/1998 | Mok ............................ 361/687 |
| 5,818,693 A | | 10/1998 | Garner et al. ............... 361/700 |
| 5,822,187 A | | 10/1998 | Garner et al. ............... 361/687 |
| 5,828,552 A | | 10/1998 | Ma .............................. 361/704 |
| 5,832,987 A | | 11/1998 | Lowry et al. .................. 165/86 |
| 5,867,370 A | * | 2/1999 | Masuda ....................... 361/814 |
| 5,882,570 A | * | 3/1999 | Hayward ................ 264/328.18 |
| 5,925,847 A | * | 7/1999 | Rademacher ............. 174/35 R |
| 6,147,301 A | * | 11/2000 | Bhatia ...................... 174/35 R |
| 6,324,055 B1 | * | 11/2001 | Kawabe ....................... 361/705 |
| 6,377,219 B2 | * | 4/2002 | Smith .......................... 361/704 |

* cited by examiner

Primary Examiner—A. Dexter Tugbang
(74) Attorney, Agent, or Firm—Barlow, Josephs & Holmes, Ltd.

(57) ABSTRACT

A structural frame (12) for dissipating heat from an electronic device (10) is provided. The structural frame (12), to which an electronic circuit board (14) containing a heat generating electronic component (16) is mounted, is injection molded from a thermally conductive, net-shape moldable polymer composition. The electronic component (16) that is within the device (10) is in thermal communication with the structural frame (12), so that the heat generated within the device (10) is transferred to the frame (14) and dissipated from the heat-generating device (10). An outer case (22) may be mounted to the frame (12) to finish the device (10) or the frame (12) may serve as all or a part of the outer device case (22) as well. In addition, the structural frame (12) has characteristics that may be engineered and used to shield the device (10) from electromagnetic interference.

3 Claims, 4 Drawing Sheets

METHOD OF MANUFACTURING A STRUCTURAL FRAME

This application is a continuation application of U.S. Ser. No. 09/725,359, filed Nov. 29, 2000 now abandoned, which claims the benefit of provisional application 60/168,275 filed on Dec. 1, 1999.

BACKGROUND OF THE INVENTION

The present invention relates generally to electronic devices, integrated circuit components and structural mounting frames for assembling such components. More specifically, the present invention relates to creating structural components for these devices that also function for dissipating the heat generated within such devices.

In the small electronics and computer industries, it has been well known to employ various types of electronic component packages and integrated circuit chips, such as the central processing chips employed within cellular telephones and the central processing units (CPU's) used within palmtop computers like the Cassiopeia manufactured by Casio. These integrated circuit chips have a pin grid array (PGA) package and are typically installed into a socket, or are soldered directly onto a computer circuit board. These integrated circuit devices, particularly the CPU microprocessor chips, generate a great deal of heat during operation which must be removed to prevent adverse effects on operation of the system into which the device is installed. For example, the CPU within the Cassiopeia, a microprocessor containing millions of transistors, is highly susceptible to overheating which could destroy the microprocessor device itself or other components proximal to the microprocessor.

In addition to the Cassiopeia microprocessor discussed above, there are many other types of semiconductor device packages that are commonly used in other types of small electronics. Recently, various types of surface mount packages, such as BGA (ball grid array) and LGA (land grid array) type semiconductor packages have become increasingly popular as the semiconductor package of choice for small electronics.

The aforementioned electronic components are commonly employed in electronic devices, such as computers and cellular phones. These devices are being manufactured smaller and smaller and include faster and faster electronic components therein. As a result, heat generation and overheating continues to be a serious concern while the sizes of the devices get smaller. Therefore, problems arise as to how to effectively cool the small electronic components within the small and cramped environments within the device. Typical cooling solutions such as heat sinks and fans are not preferred because they are large and, as a result, consume large spaces within an already cramped electronic device case. In addition, since these small devices, such as cellular phones or laptop computers, must balance competing demands for higher power requirements, smaller battery sizes with the associated power limitations and overall device case size, active cooling solutions, such as powered fans and the like, are not desirable.

These small electronic devices are fabricated by starting with a base structural frame to which all of the integrated circuit devices are attached and over which covers are installed to create the finished product. The traditional solution was to fabricate the structural chassis for these small electronic devices out of a metallic material such as aluminum or magnesium. Although these materials allowed for heat transfer, they are not as lightweight as plastics and are difficult to fabricate into the compact and complex shapes required for the small electronics devices. Often these metallic structural frames require multiple milling operations before they are ready for incorporation into the device.

In addition, electromagnetic interference shielding is often required to ensure proper operation of the electronic device. However, the metallic structural frames provide no shielding and the use of traditional EMI shielding, which typically encase the electronic component within the device to be protected, obstructs proper installation and use of effective solutions for cooling the same electronic component. Therefore, there are competing needs for EMI shielding and effective thermal transfer solutions within electronic devices, particularly in device cases where space is at a premium.

In view of the foregoing, there is a demand for a structural frame for an electronic device that is lightweight, has a low profile and is net-shape moldable from a thermally conductive material so complex geometries for optimal cooling configurations can be achieved. There is also a demand for a structural frame for an electronic device that provides passive heat dissipation for a heat generating electronic component to be cooled. There is further demand for a structural frame for an electronic device that can serve as both a structural frame and a device case. There is still further demand for a structural frame for an electronic device to provide both EMI shielding and superior heat dissipation.

SUMMARY OF THE INVENTION

The present invention preserves the advantages of prior art heat sink assemblies, structural frames and cases for electronic devices. In addition, it provides new advantages not found in currently available assemblies and overcomes many disadvantages of such currently available assemblies.

The invention is generally directed to a novel and unique electronic device construction, employing a structural frame that includes an improved heat dissipating system for cooling heat generating devices and circuit boards attached thereto. The structural frame of the present invention enables the cost-effective cooling of electronic devices while realizing superior thermal conductivity and providing improved electromagnetic shielding.

In accordance with the present invention, a structural frame for dissipating heat from an electronic device is provided. The electronic device includes an electronic circuit board with a heat generating electronic component installed thereon, mounted to the frame of the present invention. The heat generating components on the circuit board are installed in such a manner as to be in thermal communication with the frame so that the heat generated can be dissipated through the frame and away from the electronic device. In addition, outer covers or case components are mounted to the structural frame to protect the internal components and provide the finished shape of the device.

The structural frame is be injected molded from a net shape moldable thermally conductive polymer composition. Some of the surfaces of the frame are located along the external surfaces of the device so as to provide a point at which heat can be effectively dissipated as it is conducted from the interior of the device through the thermally conductive frame. As the structural frame of the present invention is fabricated from plastic materials it is lighter than the structural materials previously employed. In addition, the present invention also has the advantage of being net shape moldable, meaning, the part that is created in the injection molding process does not require any further processing steps after it is removed from the mold and before it is incorporated into the finished device. Both the lighter weight and the net-shape moldability are distinct advantages over the prior art where metallic parts had to be machined in several steps to achieve the desired part geometry.

Another feature of the present invention is the electromagnetic interference (EMI) shielding provided. Normally a separate EMI shield is installed in an electronic device. The shield acts as a shroud around the electronic component to shield it from electromagnetic interference. However, such a shield effectively encases the electronic component making access thereto for dissipating heat very difficult, if not impossible. Further, the EMI shield encasement prevents airflow to the electronic component for cooling. Since the structural frame is constructed from thermally conductive polymers it inherently absorbs EMI waves and prevents their transmission to the electronic circuitry inside the device without the installation of an additional component. This feature is particularly important in applications such as cellular telephones where EMI waves can prevent the device from functioning properly. Thus a thermally conductive polymer frame can effectively dissipate the heat generated within the device while shielding the electronic components from EMI waves without the addition of a separate EMI shield part that could potentially interfere with the heat transfer from the device.

The present invention may alternatively be molded so that in addition to serving as the structural frame for the electronic device, it also forms a substantial portion of the exterior surface of the device thus providing a finished exterior surface for the device that also provides a larger surface through which transferred heat can be dissipated.

It is therefore an object of the present invention to provide a structural frame for an electronic device that enhances the dissipation of heat from a heat generating electronic component mounted thereto.

It is an object of the present invention to provide a structural frame for an electronic device that directly provides heat dissipation for a heat generating electronic component mounted thereto.

It is a further object of the present invention to provide a structural frame for an electronic device case that passively provides heat dissipation for a heat generating electronic component mounted thereto.

Another object of the present invention is to provide a structural frame for an electronic device that simultaneously provides electromagnetic shielding and heat dissipation for an electronic component.

It is a further object of the present invention to provide a structural frame for an electronic device that is injection moldable from a thermal composite material into complex geometries to enhance thermal dissipation.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

For illustration purposes only, and by way of example, the present invention is shown to be employed for a cellular telephone. As will be seen below, the structural frame for the electronic device of the present invention can be easily employed in the fabrication of other electronic devices, such as laptop computers and personal digital assistants, for example. The invention will be described in detail below in the context of an application for a cellular telephone; however, such disclosure is not intended to limit the scope of the present invention to such an application of the present invention.

Figure 1:
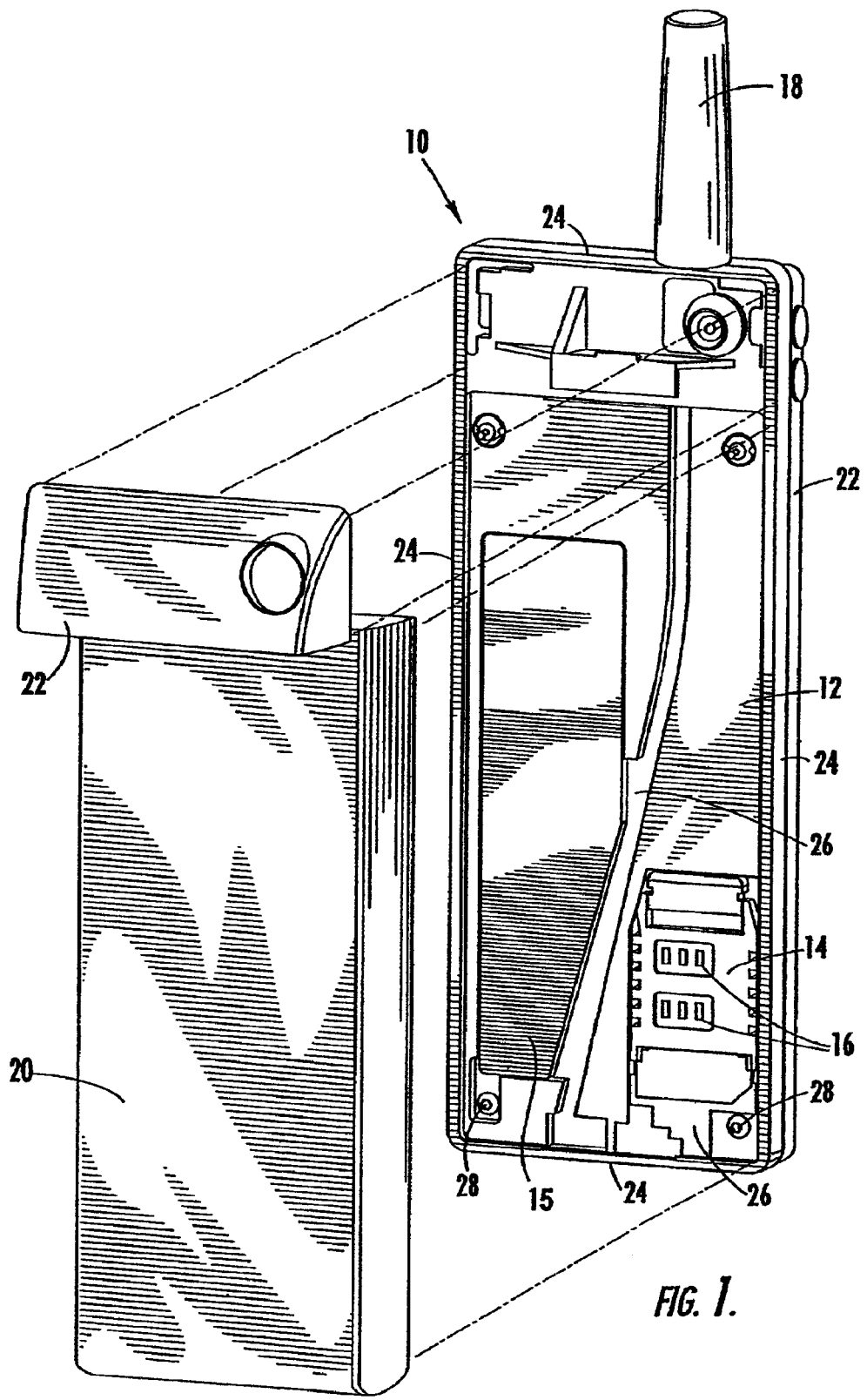
FIG. 1 is an exploded perspective view of the preferred embodiment of the electronic device showing the structural frame of the present invention.

The preferred embodiment of the present invention is shown in FIGS. 1–4. In FIG. 1, an exploded perspective view of the preferred embodiment is shown to include an electronic device that has a snap together modular construction in the form of a cellular telephone 10. The cellular telephone 10 includes a structural frame 12 with a circuit board 14 mounted thereupon. A number of heat generating electronic components 16, such as microprocessors and RAM chips, are installed on the circuit board 14. As will be shown in detail below, the structural frame 12 of the present invention provides a thermal cooling solution for these electronic components 16 without effecting the operation of the cellular telephone 10. Further, an antenna 18, a battery 20, a keypad (not shown) and device covers 22 are modularly connected to the structural frame 12 of the cellular telephone 10. As can be seen the structural frame extends 12 to the peripheral edges 24 of the cellular telephone 10 and the other components all mount to the frame 12 so as to allow these edges 24 to remain exposed. The electronic components 16 are installed into recesses 26 in the frame geometry allowing the battery 20 to be installed onto the back of the frame 12 thus protecting the components installed therein. The frame 12 provides the necessary structure for rigidly containing and protecting the components of the telephone 10. For access to the circuit board 14, for repair for example, the battery 20 and cover plate 22 may be removed. As can be seen, however, when the device is completely assembled and in normal operation, it has a compact geometry with few voids and few paths through which to conduct heat.

Figure 2:
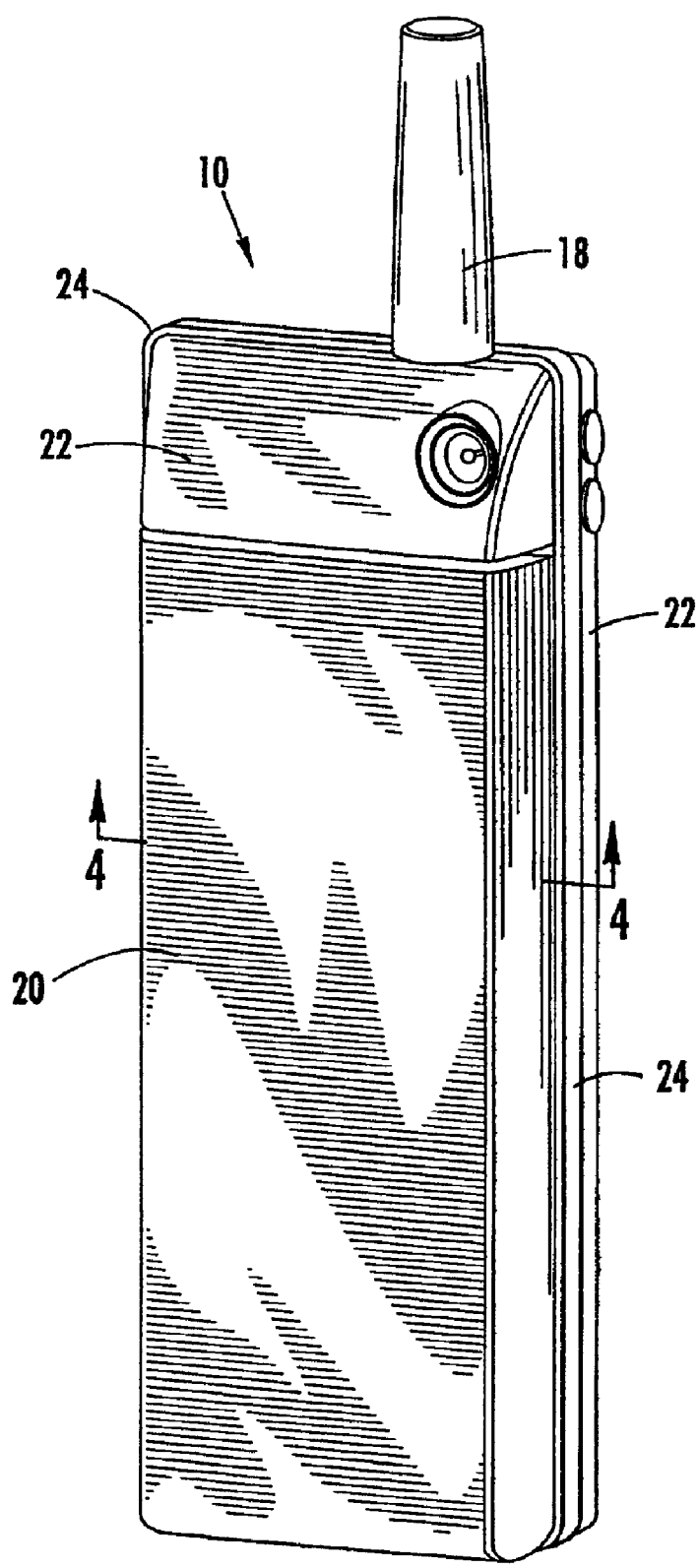
FIG. 2 is a perspective view of the device of FIG. 1 in an assembled state.

FIG. 2 illustrates the cellular telephone 10 in a closed and fully assembled position with the covers 22 installed onto the structural frame 12 and the battery 20 latched in its installed position. As can be seen, the battery 20 covers nearly the entire back of the cellular telephone 10 while the keypad (not shown) and display cover 22 nearly the entire front, leaving only the peripheral edges 24 of the structural frame 12 exposed for heat dissipation.

In accordance with the present invention, the structural frame 12 is used as a heat dissipating structure within the cellular telephone 10. More specifically, the structural frame 12 is manufactured of a thermally conductive material. Preferably, the structural frame 12 is manufactured from a thermally conductive net-shape molded polymer composition. The structural frame 12 is net-shape molded which means that after the frame is molded, such as by injection molding, further machining of the part is not necessary because it has been molded into its final shape and configuration as actually used. The polymer composition that is preferred includes a polymer base matrix such as a liquid crystal polymer. The polymer is preferably loaded with thermally conductive filler, such as carbon fiber, copper flakes, boron nitride powder, and the like.

Figure 3:
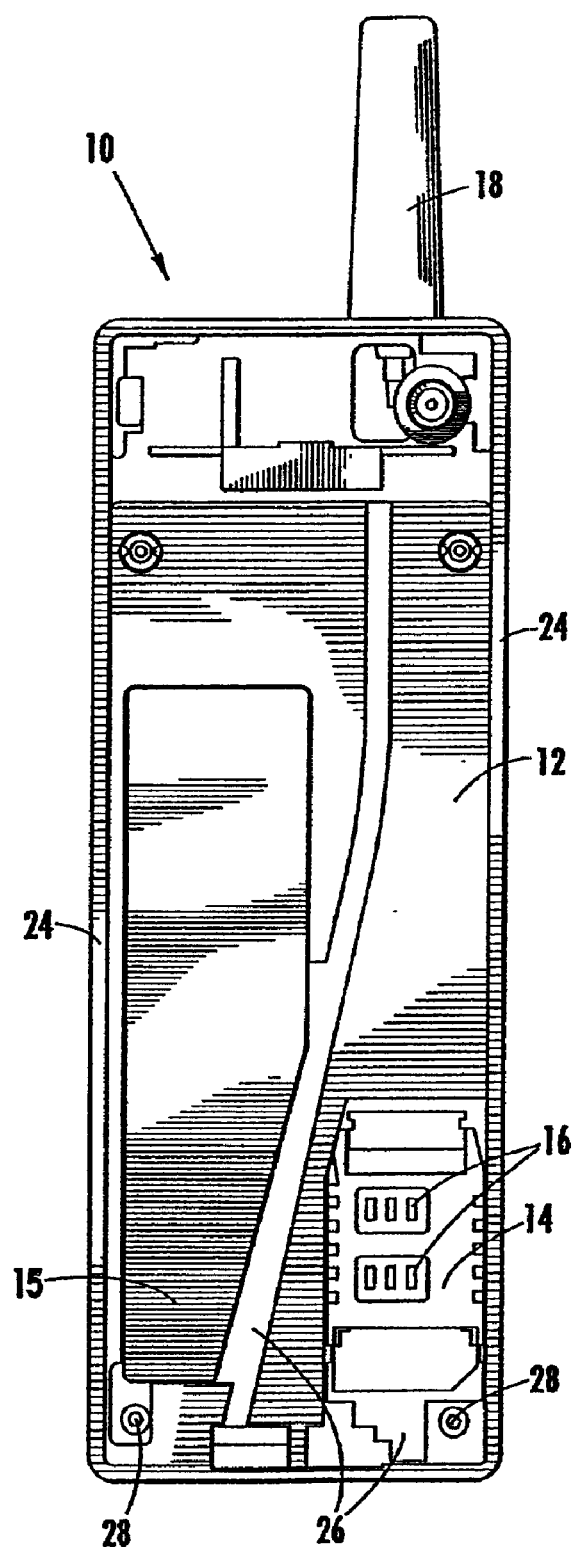
FIG. 3 is a top view of the device with the battery and case parts removed for clarity; and, FIG. 4 is a cross-sectional view through the line 4—4 of FIG. 2.

In FIG. 3, the thermally conductive structural frame 12, shown in top view, has molded recesses 26 into which the electronic components 16, installed on a circuit board 14, are mounted. As the circuit board 14 is mounted onto the thermally conductive frame 12, the two components are in thermal communication. Heat generated from the electronic components 16 dissipate into the surrounding structural frame 12 and out through the peripheral edges 24 of the structural frame 12 of the cellular telephone 10. As a result, passive thermal dissipation of heat from electronic components 16 within an electronic device can be achieved.

Figure 4:
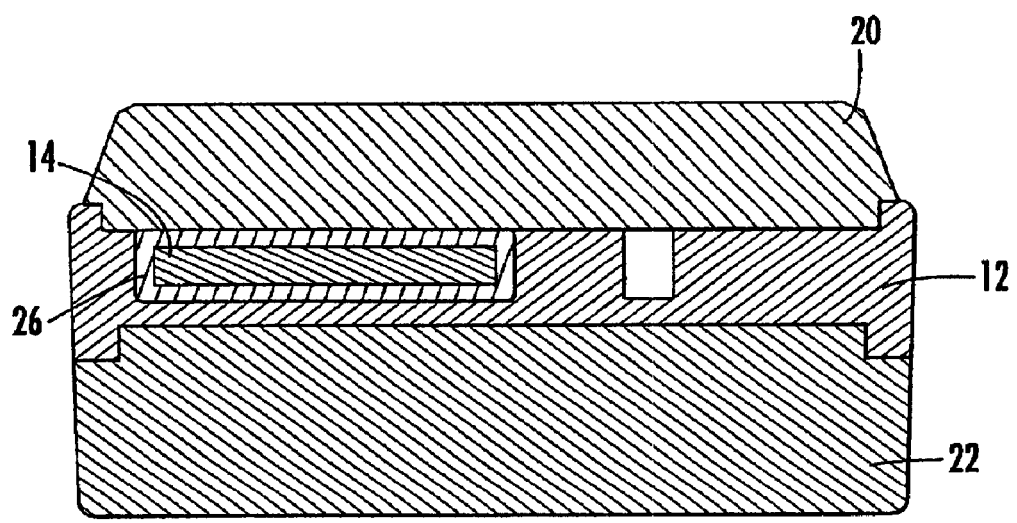

In FIG. 4 a cross section through the cellular telephone device 10 is shown. This figure illustrates the compact geometry of the fully assembled device 10 and the limited paths through which heat can be dissipated. As stated earlier, the battery 20 nearly fully covers the back of the device and the keypad 22 nearly fully covers the front. This results in a requirement for dissipating heat generated within the device at the peripheral edges 24 of the structural frame 12.

Referring to both FIGS. 3 and 4 an additional feature of the preferred embodiment of the present invention can be seen. A number of electronic components 16 are installed on a circuit board 14 within a cellular telephone 10. As discussed above, EMI shielding is frequently required to ensure that the electronic components 16 and, therefore, the entire electronic device operates properly. Details of the operation of an EMI shield need not be discussed herein because such EMI shielding methods are well known. As can be understood, the installation and positioning of an EMI shield about the electronic components 16 prevents access to the electronic components 16 for attachment of thermal solutions, such as heat sinks and other cooling solutions. Moreover, encasing the electronic components 16 within an EMI shield prevents exposure of the electronic components 16 to air or other components within a device, which is a common method for cooling electronic components 16.

As best seen in FIGS. 3 and 4, the circuit board 14 is installed into recesses within the structural frame 26, for example, with fasteners. The structural frame 12 substantially surrounds the circuit board 14 and electronic components 16. In accordance with the present invention, as the structural frame 12 is constructed from a thermally conductive polymer composition, its inherent properties include the ability to absorb EMI waves. This geometry, therefore, allows the structural frame 12 to absorb the EMI waves and prevent their transmission to the electronic components 16 within the device, allowing the device to function without the deleterious effects of EMI transmission. With the present invention, simultaneous EMI shielding and heat dissipation of the same group of electronic components 16 can be achieved, which was not possible in prior art electronic device structural frames.

Further, the frame 12 may be coated with a metallic material, such as nickel, to reflect EMI waves as opposed to absorbing them. Such EMI wave reflection may be preferred in certain applications of the present invention.

It is preferred that the structural frame 12 be manufactured from a unitary molded member of a thermally conductive polymer or the like. For example, a polymer base matrix loaded with conductive filler material, such as PITCH carbon fiber, may be employed as the material for the present invention. Such unitary construction is unlike that found in the prior art and provides significant advantages including low cost, ease of manufacture and flexibility of heat geometry due to the ability to mold the assembly as opposed to machining it.

It would be appreciated by those skilled in the art that various changes and modifications can be made to the illustrated embodiments without departing from the spirit of the present invention. All such modifications and changes are intended to be covered by the appended claims.

What is claimed is:

1. A method of manufacturing a structural frame for dissipating heat from an electronic device, comprising:

providing a base polymer matrix;

mixing a thermally conductive filler material into said base polymer matrix to form molding material having a uniform distribution of said conductive filter material throughout said entire molding material;

net-shape injection molding said molding material into a highly thermally conductive structural frame for supporting electronic components, wherein said thermal conductivity of said structural frame creates a thermally conductive pathway through the structural frame from an interior portion of said frame to an exterior portion of said frame;

providing an electronic circuit board, said electronic circuit board having a heat generating electronic component disposed thereon; and mounting said electronic circuit board in direct physical contact with the interior portion of said structural frame with said electronic component being in thermal communication with said structural frame via said electronic circuit board;

conducting heat from said heat generating electronic component along said thermally conductive pathway from said interior portion of said structural frame to said exterior portion of said structural frame; and dissipating said conducted heat to the atmosphere from said exterior portion of said structural frame.

2. The method of manufacturing a structural frame of claim 1, wherein said base polymer matrix is liquid crystal polymer.

3. The method of manufacturing a structural frame of claim, 1 wherein said thermally conductive filler material is selected from the group consisting of carbon fiber, metallic flakes, boron nitride and mixtures thereof.

\* \* \* \* \*